United States Patent
El-Mansouri et al.

(10) Patent No.: US 10,170,448 B2
(45) Date of Patent: Jan. 1, 2019

(54) APPARATUS AND METHOD OF POWER TRANSMISSION SENSING FOR STACKED DEVICES

(71) Applicant: Micron Technology, Inc., Boise, ID (US)

(72) Inventors: Adam S. El-Mansouri, Boise, ID (US); Fuad Badrieh, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 15/372,246

(22) Filed: Dec. 7, 2016

(65) Prior Publication Data

US 2018/0158800 A1    Jun. 7, 2018

(51) Int. Cl.
*H01L 25/065* (2006.01)
*G05F 1/10* (2006.01)

(52) U.S. Cl.
CPC ............ *H01L 25/0657* (2013.01); *G05F 1/10* (2013.01); *H01L 2225/06513* (2013.01); *H01L 2225/06517* (2013.01); *H01L 2225/06524* (2013.01); *H01L 2225/06541* (2013.01)

(58) Field of Classification Search
CPC ....... H01L 25/0657; H01L 2225/06524; H01L 2225/06513; H01L 2225/06541; H01L 2225/06517
See application file for complete search history.

(56) References Cited

U.S. PATENT DOCUMENTS

| | | | |
|---|---|---|---|
| 2011/0050320 A1* | 3/2011 | Gillingham | G11C 5/02 327/365 |
| 2011/0121811 A1* | 5/2011 | Dennard | H01L 23/642 323/318 |
| 2011/0187443 A1* | 8/2011 | Jin | G05F 1/10 327/536 |
| 2012/0105142 A1* | 5/2012 | Im | G05F 1/56 327/543 |
| 2012/0249222 A1* | 10/2012 | Ko | G06F 1/32 327/530 |
| 2012/0250443 A1* | 10/2012 | Saraswat | G11C 5/14 365/226 |
| 2013/0093454 A1* | 4/2013 | Lai | G01R 31/318513 324/762.01 |

(Continued)

*Primary Examiner* — Thomas J. Hiltunen
(74) *Attorney, Agent, or Firm* — Dorsey & Whitney LLP

(57) ABSTRACT

Apparatuses for supplying power supply voltage in a plurality of dies are described. An example apparatus includes: a circuit board; a regulator on the circuit board that regulates a first voltage; a semiconductor device on the circuit board that receives the first voltage through a power line in the circuit board. The semiconductor device includes: a substrate on the circuit board, stacked via conductive balls, that receives the first voltage from the power line via the conductive balls; a plurality of dies on the semiconductor device, stacked via bumps, each die including a first conductive via that receives the first voltage via the bumps; a plurality of pillars between adjacent dies and couple the first conductive vias of the adjacent dies; and a sense node switch circuit that selectively couples one first conductive via of one die among the plurality of dies to the regulator.

18 Claims, 5 Drawing Sheets

(56) References Cited

U.S. PATENT DOCUMENTS

| | | | |
|---|---|---|---|
| 2013/0093455 A1* | 4/2013 | Whetsel | G01R 31/318541 |
| | | | 324/762.03 |
| 2013/0162282 A1* | 6/2013 | Hatakeyama | H01L 22/30 |
| | | | 324/762.01 |
| 2013/0279276 A1* | 10/2013 | Schaefer | G11C 7/00 |
| | | | 365/189.011 |
| 2014/0264730 A1* | 9/2014 | Haba | H01L 23/5256 |
| | | | 257/529 |
| 2014/0368224 A1* | 12/2014 | Lee | G01R 27/205 |
| | | | 324/713 |
| 2015/0168972 A1* | 6/2015 | Mathiyalagan | G05F 1/625 |
| | | | 365/226 |
| 2015/0338863 A1* | 11/2015 | Ikeda | G05F 1/461 |
| | | | 365/226 |
| 2017/0125383 A1* | 5/2017 | Liu | H01L 25/0657 |
| 2017/0162545 A1* | 6/2017 | Park | H01L 25/0657 |

\* cited by examiner

APPARATUS AND METHOD OF POWER TRANSMISSION SENSING FOR STACKED DEVICES

BACKGROUND

High data reliability, high speed of memory access, lower power consumption and reduced chip size are features that are demanded from semiconductor memory. In recent years, three-dimensional (3D) memory devices by stacking dies vertically and interconnecting the dies using through-silicon (or through-substrate) vias (TSVs) have been introduced to provide larger memory capacity with a relatively small footprint. Benefits of the 3D memory devices include a plurality of dies stacked with a large number of vertical vias (TSVs) between the plurality of dies and the memory controller, which allow wide bandwidth buses with high transfer rates between functional blocks in the plurality of dies, and a considerably small footprint. Thus, the 3D memory devices contribute to large memory capacity, higher memory access speed and chip size reduction. The 3D memory devices include Hybrid Memory Cube (HMC) and High Bandwidth Memory (HBM).

The large number of vertical vias may transfer a clock signal, memory cell data and command sequences for controlling the dies simultaneously in a manner that the plurality of dies can be operated independently and/or simultaneously at high transfer rates. The 3D memory device may supply power to a plurality of dies including a large number of circuits that may operate simultaneously, which causes simultaneous power consumption throughout the device. However, there is voltage loss, such as voltage drop, across the plurality of dies mostly due to impedance of TSVs.

FIG. 1 is a schematic diagram of a portion of a semiconductor device 1 including a plurality of dies 4. The semiconductor device 1 may include a semiconductor package 2 that is mounted on a printed circuit board 8 via conductive balls 9. For example, the conductive balls 9 may be solder balls that function as sensing points of voltages used by a regulator (not shown) that adjusts power supply. The semiconductor package 2 may include a plurality of dies 4 mounted on a package substrate 3 via bumps 7. The plurality of dies 4 may include conductive vias 6 (e.g., through substrate electrodes) which couple the plurality of dies 4 by penetrating the plurality of dies 4 together with pillars 5 between the plurality of dies 4.

FIG. 2 is a simplified circuit diagram of a power supply circuit 10 in the semiconductor device 1. A sense ball 27 between the printed circuit board 8 and the package substrate 3 may be coupled to one of input nodes of an operational amplifier 21. Thus a voltage sensed at the sense ball 27 may be used as a reference voltage to adjust an output voltage of the operational amplifier 21. Thus, a voltage at the sense ball 27 may be adjusted using the output voltage of the operational amplifier 21. However, as a number of the plurality of dies 4 increases, the voltage drop becomes exacerbated due to the increased impedance 23 of the pillars 5 and conductive vias 6 in the plurality of dies 4, in addition to the impedance of a circuit component 22 in the package substrate 3. The voltage drop further becomes exacerbated due to on-die bussing of each die 4 and package bussing of the circuit board 8, each conductive ball 9 and each bumps 7. Such voltage drops are not reflected on the voltage at the sense ball 27 and uncompensated voltage drops are provided to the sense ball 27. The uncompensated voltage drop may cause unstable operations at portions of the large number of circuits.

DETAILED DESCRIPTION OF PREFERRED EMBODIMENTS

Various embodiments of the present invention will be explained below in detail with reference to the accompanying drawings. The following detailed description refers to the accompanying drawings that show by way of illustration, specific aspects and embodiments in which the present invention may be practiced. These embodiments are described in sufficient detail to enable those skilled in the art to practice the present invention. Other embodiments may be utilised, and structure, logical and electrical changes may be made without departing from fee scope of the present invention. The various embodiments disclosed herein are not necessary mutually exclusive, as some disclosed embodiments can be combined with one or more other disclosed embodiments to form new embodiments.

Figure 1:
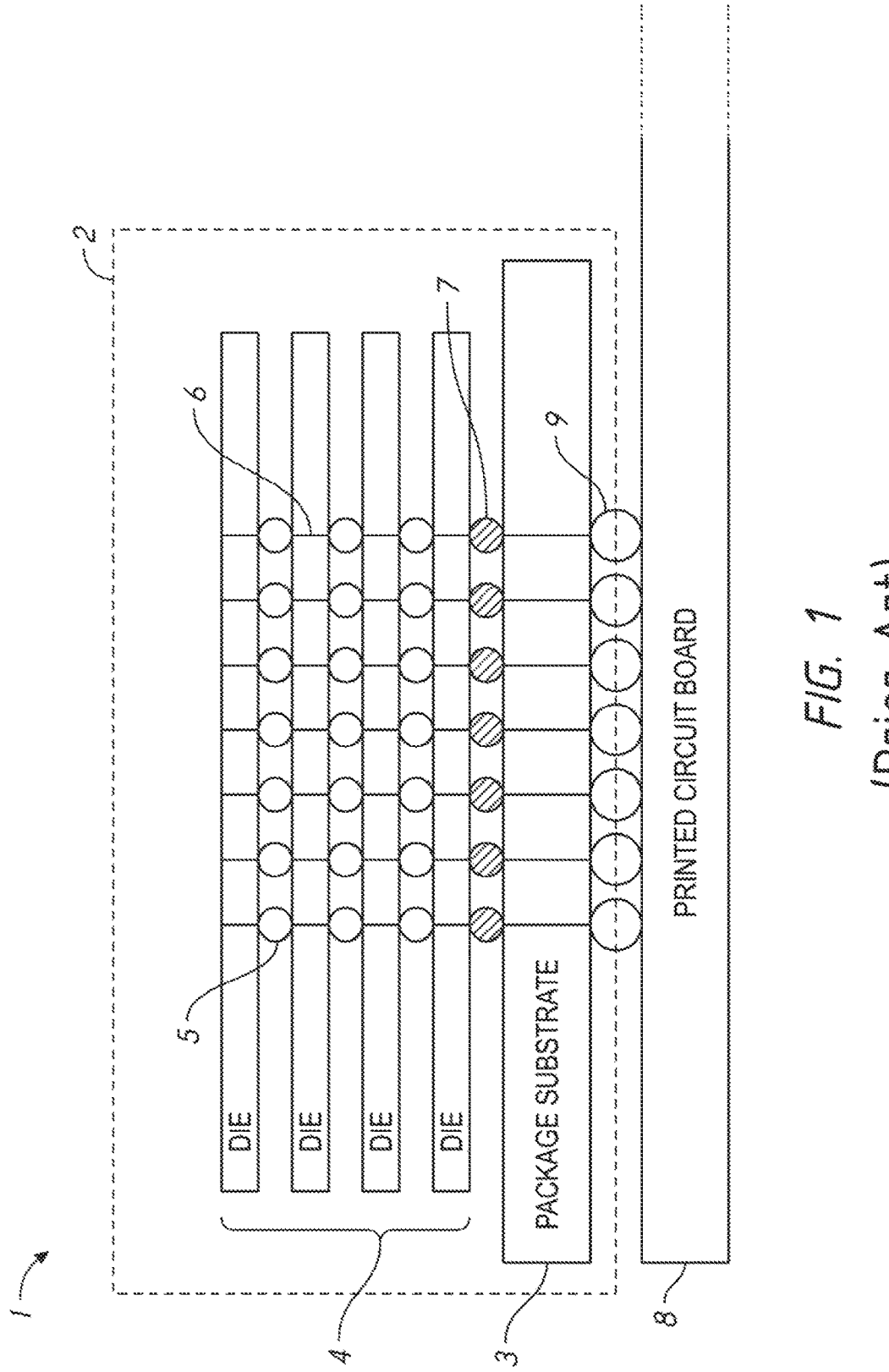
FIG. 1 is a schematic diagram of a portion of a semiconductor device including a plurality of dies.
Figure 2:
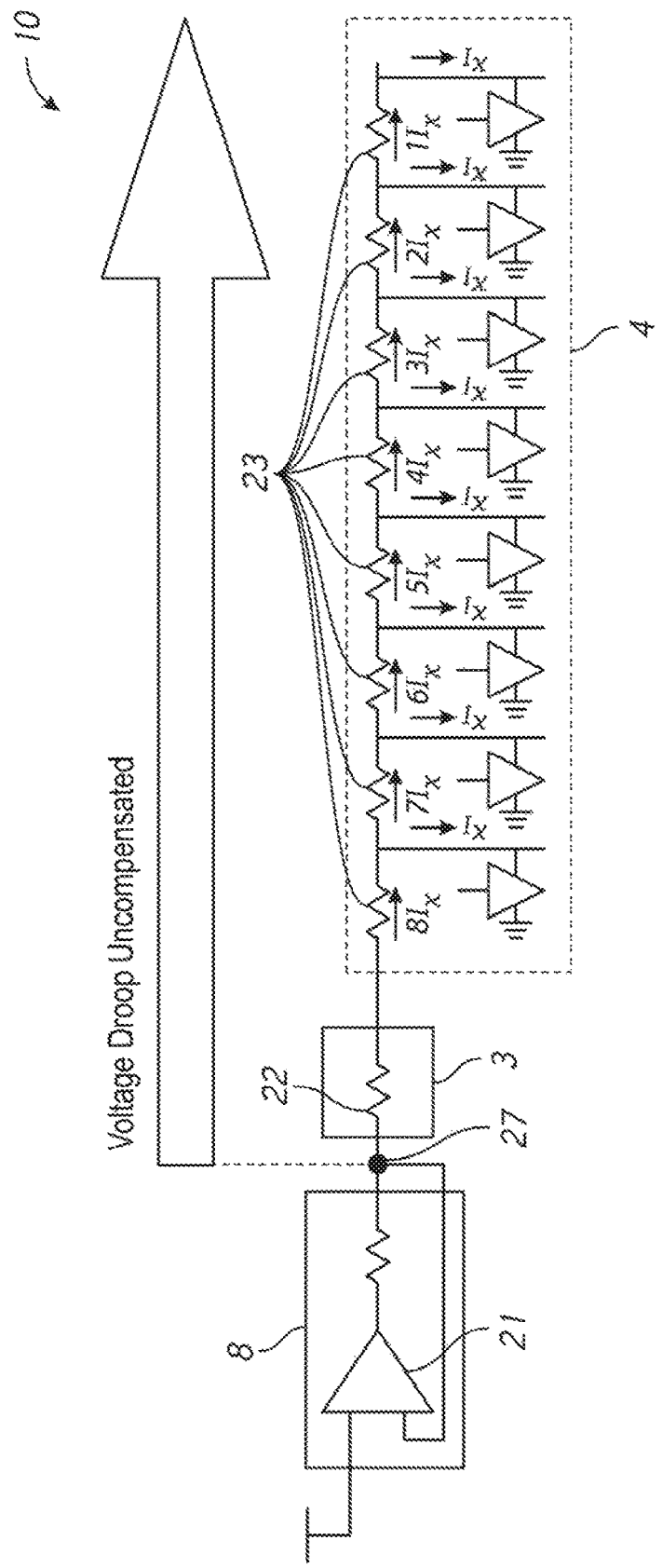
FIG. 2 is a simplified circuit diagram of a power supply circuit in the semiconductor device.
Figure 3:
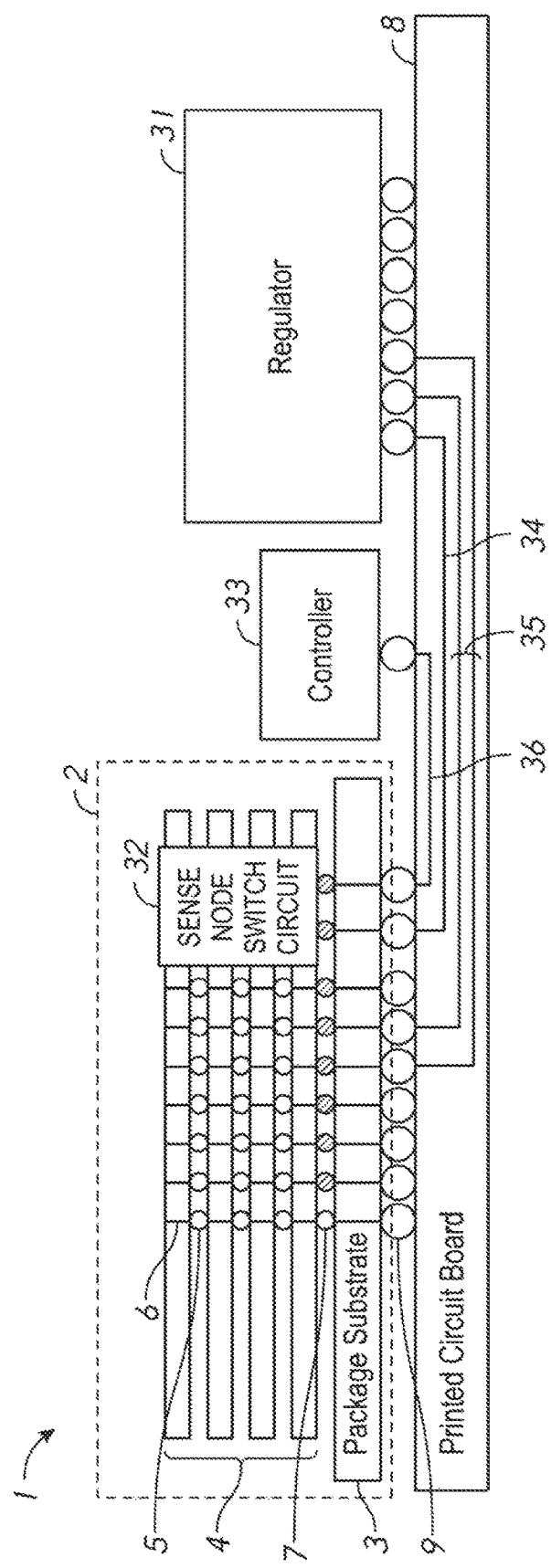
FIG. 3 is a schematic diagram of a semiconductor device including a plurality of dies in accordance with an embodiment of the present disclosure.

FIG. 3 is a schematic diagram of an electronic device or apparatus 1 in accordance with an embodiment of the present disclosure. For example, the device or apparatus 1 may include a semiconductor package 2, a regulator 31 which may be a voltage regulator module, and a controller 33 on a printed circuit board 8. The semiconductor package 2 may include a plurality of dies 4 mounted on a package substrate 3 via bumps 7 made of, for instance, solder. For example, the semiconductor package 2 may be a three-dimensional (3D) memory, such as an HBM, an HMC, a Wide-IO DRAM, etc. The plurality of dies 4 may be stacked with each other. The plurality of dies 4 may not be limited to slacked dies. For example, the plurality of dies 4 may be disposed on the package substrate.

In this example, each die 4 may be a memory chip. Each of the die 4 may include a plurality of memory cells and circuitries accessing the memory cells. For example, the plurality of dies 4 may include DRAM memory cells. The plurality of dies 4 may be stacked to each other and coupled to each other by pillars (or microbumps) made of, for instance, solder 5. Each die of the plurality of dies 4 may include conductive vias 6 (e.g., through substrate vias/ electrodes (TSVs) penetrating each die 4. The conductive vias 6 may couple the plurality of dies 4 to each other by coupling the pillars 5. The plurality of dies 4 may be coupled to the package substrate 3 via bumps 7. For example, the bumps 7 may be microbumps having bump pitches of less than about or less than one hundred micro meters and exposed on a surface of a die 4 facing the package substrate 3. The semiconductor package 2 may include a sense node switch circuit 32 that is described in details later in this disclosure. The printed circuit board 8 may include a sense line 34, one or more power lines 35 and a control line 36. The one or more power lines 35 may provide a power supply voltage to conductive balls 9 coupling the package substrate 3 to the printed circuit board 8. The sense line 34 may provide a sensed voltage from the sense node switch circuit 32 to the regulator 31 by a conductive ball 9 coupling the package substrate 3 to the printed circuit board 8. The control line 36 may provide a control signal from the controller 33 to the sense node switch circuit 32 by a conductive ball 9 coupling the package substrate 3 to the printed circuit board 8.

A portion of the bumps 7 may be coupled to the one or more power lines 35 via buses (e.g., vias) on the package substrate 3 and the conductive balls 9. A portion of the bumps 7 may be coupled to a plurality of channels (not shown). At least one bump of the bumps 7 may be coupled to the sense line 34 and another at least one bump of the bumps may be coupled to the control line 36. Thus, the one or more power lines 35 and the sense line 34 may be coupled to the regulator 31. The regulator 31 may adjust power supply to the plurality of dies 4 responsive to voltages on the sense line 34. The controller 33 may provide the control signal to the sense node switch circuit 32 to control which die of the plurality of dies 4 may be coupled to the sense line 34 for sensing the power supply voltage including drop of the power supply voltage. While the controller 33 and the regulator 31 are shown as separate components, they may be incorporated into one component or device as a single integrated circuit.

Figure 4:
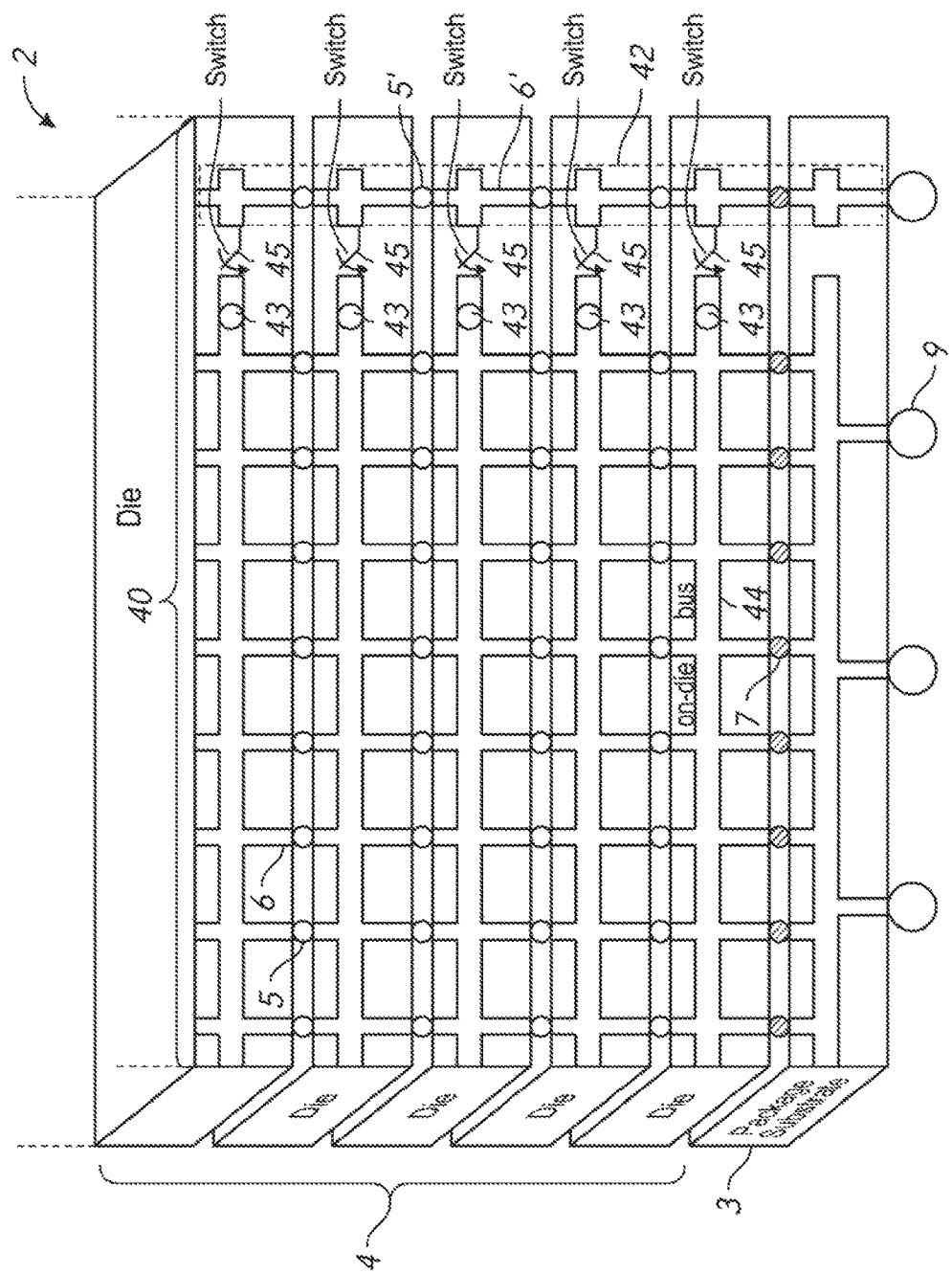
FIG. 4 is a three-dimensional schematic view of a portion of the power supply circuit in the semiconductor device in accordance with an embodiment of the present disclosure.

FIG. 4 is a three-dimensional schematic diagram of a portion of a power supply circuit or network 40 in a semiconductor package 2 in accordance with an embodiment of the present disclosure. The semiconductor package 2 may be the semiconductor package 2 in FIG. 3. For example, the semiconductor package 2 may include a package substrate 3 and a plurality of dies 4 stacked above the package substrate 3, where the plurality of dies 4 are coupled to the package substrate 3 via bumps 7. Conductive balls 9 may include power supply voltage balls and a sensing ball coupled to the package substrate 3. The power supply voltage balls of conductive balls 9 may provide power supply voltages (e.g., positive supply voltage VDD, etc.) to the semiconductor package 2 via the package substrate 3. The power supply voltages on the package substrate 3 may be provided to the plurality of dies 4 via the bumps 7 and TSVs 6. The semiconductor package 2 may include pillars (or microbumps) 5 between adjacent dies of the plurality of dies 4 stacked to each other. Each die of the plurality of dies 4 may include conductive vias 6 (e.g., through substrate electrodes (TSVs)) penetrating each die 4. The conductive vias 6 may couple the plurality of dies 4 to each other by coupling the pillars 5. Each die of the plurality of dies 4 may include on-die buses 44 coupled to each conductive vias 6 of each die. Thus, a power conductive path including the conductive vias 6 on the plurality of dies 4 and the pillars 5 are coupled to the package substrate 3 via the bumps 7. Thus, the power supply voltages from the power supply voltage balls of conductive balls 9 may be provided through the power conductive path to circuitry of each die of the plurality of dies 4 via the on-die bus 44.

The power supply circuit 40 may include an in-package sense line circuit 42. For example, the in-package sense line circuit 42 may be included in the sense node switch circuit 32 of FIG. 3. The in-package sense line circuit 42 may include a plurality of conductive vias 6' in each die of the plurality of dies 4 and a plurality of pillars (or microbumps) 5' that may couple conductive vias 6' of adjacent dies of the plurality of dies 4 to each other. The on-die bus 44 of each die of the plurality of dies 4 may include a sensing node 43.

Each die of the plurality of dies 4 may include a switch 45 disposed between the sensing node 43 and the conductive via 6'. The switch 45 may selectively couple the sensing node 43 to the conductive via 6', when the switch 45 of a die of the plurality of dies 4 is activated (e.g., turned on, closed). A sensed voltage, which is a power supply voltage including voltage drop at the sensing node 43 coupled to the switch 45, may be provided to the sensing ball of the conductive balls 9 via the conductive vias 6' and the pillars 5' in the in-package sense line circuit 42. The sensing ball of the conductive balls 9 may be coupled to the regulator 31 of FIG. 3, thus the sensed voltage may be provided to the regulator 31. Based on the sensed voltage, the regulator 31 may regulate the power supply voltages. The switch 45 may selectively decouple the sensing node 43 from the conductive via 6', when the switch 45 of the die of the plurality of dies 4 is deactivated (e.g., turned off, open).

Although not shown in FIG. 4, the package substrate 3 may include a plurality of switch control bumps that are coupled to the switches 45, respectively, through TSVs and pillars/microbumps. The switch control bumps are further coupled to the controller 33 in FIG. 3. The controller 33 may thus activate a selected one of the switches 45 by supplying a set of selection signals to the switch control bumps. In some embodiments, the switches 45 may be controlled through fuses or various types of nonvolatile memory circuits (NVM) that may be inside or outside the semiconductor package 2. The switches 45 may be further controlled through a mode register that may be inside or outside the semiconductor package 2 and whose contents may be set by the controller 33 in FIG. 3. The switch 45 may be programmed either in the course of manufacturing the semiconductor package 2 through programming fuses or NVM or after installing the semiconductor package 2 in a system through setting data into the mode register.

Figure 5:
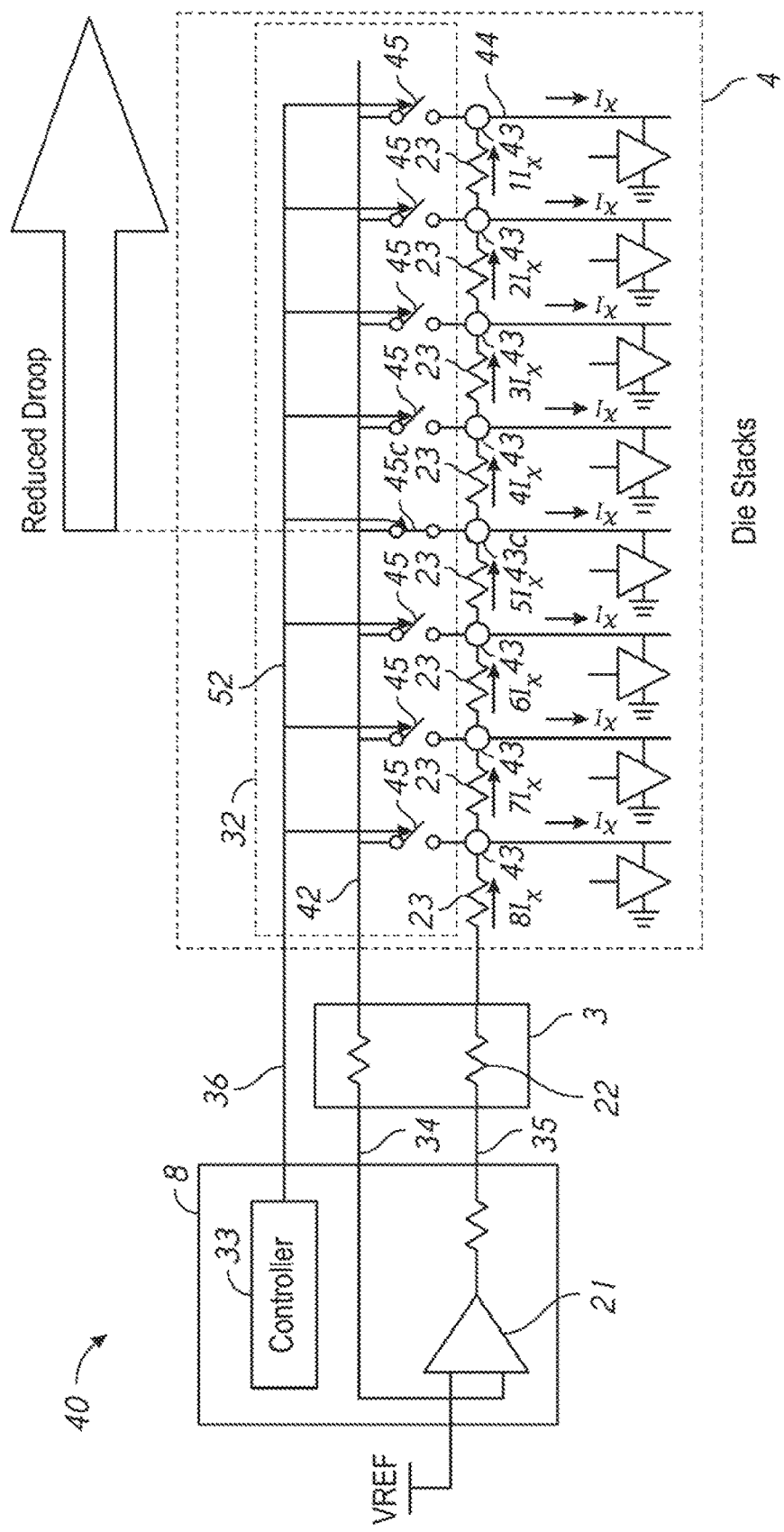
FIG. 5 is a simplified circuit diagram of a power supply circuit in the semiconductor device in accordance with an embodiment of the present disclosure.

FIG. 5 is a simplified circuit diagram of a power supply circuit/network 40 in the semiconductor device 1 in accordance with an embodiment of the present disclosure. On a printed circuit board 8, an operational amplifier 21, the controller 33, and a package substrate 3 may be disposed. For example, the operational amplifier 21 may be the regulator 31 in FIG. 3 that regulates the power supply voltage in response to the sensed voltage led back through the sense line 34 and a reference voltage VREF. In some embodiments, the operational amplifier 21 may be replaced with any types of voltage regulators that may receive one or more feedback signals from the sense line 34 to stabilize an output voltage of the one or more power lines 35 under various load conditions. The plurality of dies 4 may include resistance components 23, including resistance of conductive vias 6 and resistance of pillars 5. For example, a leftmost resistance component 23 may include a resistance of a bump 7 and a resistance of the conductive via 6 of a die that is directly coupled to the package substrate 3 via the bump 7. Any other resistance components 23 may include a resistance of a conductive via 6 of a die 4 and a resistance of a pillar 5 between the conductive vias 6 of the die 4 and a left adjacent die 4 of the die 4. If a current provided to each die is Ix, a current of the leftmost resistance component 23 may be 8Ix, and other currents of the resistance components 23 in order from left to right may be 7Ix, 6Ix, . . . , and 1Ix. Each die 4 of the plurality of dies 4 may include a sensing node 43 between adjacent resistance components 23. A voltage (e.g., sensed voltage) at the sensing node 43 of each die 4 may be a power supply voltage including voltage drop at each die. The sensed voltage may be provided to a circuitry of each die 4.

The plurality of dies 4 may include a sense node switch circuit 32. For example, the sense node switch circuit 32 may be the sense node switch circuit 32 in FIG. 3. The sense node switch circuit 32 may include an in-package sense line circuit 42, an in-package control line circuit 52 and a plurality of switches 45 in each die 4.

A controller 33 (e.g., the controller 33 in FIG. 3) may provide a set of control signals, which causes one of the plurality of switches 45 to selectively couple a corresponding sensing node 43c to the in-package sense line circuit 42. For example, the controller 33 may provide the control signal to the in-package control line circuit 52. The in-package control line circuit 52 may provide the set of control signals from the controller 33 via a control bus line 36 (e.g., the control line 36 in FIG. 3) and the package substrate 3. The set of control signals may be indicative of a die 4 to be selectively coupled to a sense line 34 (e.g., the sense line 34 in FIG. 3). Based on die control signal, one switch of the plurality of switches 45 may be selectively activated (e.g., turned on, closed). For example, in FIG. 5, the switch 45c may be turned on and the switch 45c may selectively couple a sensing node 43c to the in-package sense line circuit 42, while the switches 45 other than the switch 45c may be turned off (e.g., deactivated, open) and decouples corresponding sensing nodes 43c from the in-package sense line circuit 42, responsive to the control signal.

For example, the in-package sense line circuit 42 may be the in-line sense line circuit 42 in FIG. 4. The sensing node 43c of each die 4 may be selectively coupled to the in-package sense line circuit 42, and the in-package sense line circuit 42 may provide the sense voltage at 43c to the sense line. The sense line 34 may provide the sensed voltage from the in-package sense line circuit 42 in the sense node switch circuit 32 to one of input nodes of the operational amplifier 21. The sensed voltage at the sensing node 43c may be used as a reference voltage to adjust an output voltage of the operational amplifier 21 via a power line 35(e.g., the one or more power lines 35 in FIG. 3). Thus, the operational amplifier 21 may adjust the output voltage responsive to the sensed voltage.

For example, it may be possible to control the sense node switch circuit 32, as a number of the plurality of dies 4 increase, in order to observe the exacerbated voltage drop due to the increased impedance 23 of the pillars 5 and conductive vias 6 in the plurality of dies 4, in addition to the impedance of a circuit component 22 in the package substrate 3. For example, the controller 33 may provide the control signal indicative of activating a switch 45 farther than the switch 45c from the package substrate 3, to couple a farther die 4. Since the voltage drop, which is caused by the increased impedance of the pillars 5 and the conductive vias 6 in the increased number of dies 4 in addition to the circuit component 22 in the package substrate 3, may be reflected on the sensed voltage at the sensing node 43 coupled by the switch 45 farther than the switch 45c to the in-package sense line circuit 42, the operational amplifier 21 may provide the power supply voltage to the power line 35 after compensating the voltage drop accordingly responsive to the sensed voltage.

In FIGS. 3 to 5, the package substrate 3 may be replaced with an interface chip (or die) that may control operations of the plurality of dies 4. In this case, the interface chip may be further equipped with a functional circuit block equivalent to the regulator 31 and another functional circuity block equivalent to a function of the controller 33 that may control the sense node switch circuit 32, including selective activations of the switches 45.

Levels of signals used in the embodiments described the above are merely examples. However, in other embodiments, combinations of the levels of signals other than those specifically described in the present disclosure may be used without departing from the scope of the present disclosure.

Although this invention has been disclosed in the content of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a substrate;
    a plurality of dies, each die of the plurality of dies comprising:
        a circuit;
        a first conductive via through each die, configured to provide a power supply voltage;
        an on-die bus coupled to the first conductive via and configured to provide the power supply voltage from the first conductive via to the circuit;
        a second conductive via through each die; and
        a switch disposed between the on-die bus and the second conductive via, configured to selectively couple the on-die bus to the second conductive via,
    a first conductive path across the substrate and the plurality of dies, configured to provide the power supply voltage to the first conductive via, the first conductive path comprising:
        a first bump between the substrate and the plurality of dies, coupled to a corresponding first conductive via of a die of the plurality of dies adjacent to the substrate and the first bump configured to provide the power supply voltage to the corresponding first conductive via;
        a plurality of the first pillars configured to couple the first conductive vias of adjacent dies of the plurality of dies to each other; and
        the plurality of first conductive vias; and
    a second conductive path across the substrate and the plurality of dies, the second conductive path comprising:
        a second bump between the substrate and the plurality of dies, coupled to a corresponding second conductive via of the die of the plurality of dies adjacent to the substrate;
        a plurality of second pillars configured to couple the second conductive vias of adjacent dies of the plurality of dies to each other; and
        the plurality of the second conductive vias.

2. The apparatus of claim 1, wherein the on-die bus on each die of the plurality of dies comprises a sensing node, and wherein the second bump is configured to receive a sensed voltage at the sensing node.

3. The apparatus of claim 2, wherein the sensing node is located between the switch and the first conductive via.

4. The apparatus of claim 1, further comprising:
a third conductive via in each die of the plurality of dies; and
a third conductive path across the substrate and the plurality of dies, comprising the third conductive via,
wherein the third conductive via is coupled to the switch and configured to provide a control signal to the switch, and
wherein the switch is configured to couple the on-die bus to the second conductive via or decouple the on-die bus from the second conductive via, responsive to the control signal.

5. The apparatus of claim 4, wherein the third conductive path comprises:
a third bump between the substrate and the plurality of dies, coupled to the third conductive via of the die of the plurality of dies adjacent to the substrate, and configured to provide the control signal; and
a plurality of third pillars configured to couple the third conductive vias of adjacent dies of the plurality of dies to each other.

6. An apparatus, comprising:
an operational amplifier configured to provide a first voltage;
a plurality of resistance components coupled in series and configured to receive the first voltage from the operational amplifier;
a plurality of sensing nodes between adjacent resistance components;
a sense line circuit configured to provide a second voltage from a sensing node of the plurality of sensing nodes; and
a plurality of switches, each switch of the plurality of switches being disposed between the sense line circuit and each of the plurality of sensing nodes,
wherein each switch of the plurality of switches is configured to be selectively activated to selectively couple the corresponding sensing node to the sense line circuit, and
wherein the sense line circuit comprises a plurality of conductive vias and a plurality of pillars coupling adjacent conductive vias to each other.

7. The apparatus of claim 6, wherein the operational amplifier is configured to receive the second voltage and further configured to adjust the first voltage responsive to the second voltage.

8. The apparatus of claim 7, further comprising:
a controller configured to provide a control signal; and
a control line circuit coupled to the plurality of switches and configured to provide the control signal from the controller to the plurality of switches,
wherein each switch of the plurality of switches is configured to be selectively activated to selectively couple the corresponding sensing node to the sense line circuit responsive to the control signal.

9. The apparatus of claim 8, further comprising a semiconductor device and a circuit board,
wherein the controller and the operational amplifier are disposed on the circuit board,
wherein the semiconductor device comprises a plurality of dies,
wherein the control line circuit and the sense line circuit are shared by the plurality of dies, and
wherein each die of the plurality of dies includes each corresponding conductive via, each corresponding switch and the corresponding sensing node.

10. The apparatus of claim 9,
wherein each die includes a conductive via coupled to the sensing node, and
wherein each resistance component of the plurality of resistance components includes at least partly a resistance of the conductive via.

11. The apparatus of claim 9, wherein the semiconductor device further comprises a substrate on the circuit board,
wherein the plurality of dies are stacked to each other on the substrate.

12. An apparatus comprising:
a circuit board;
a regulator on the circuit board, configured to regulate a first voltage; and
a semiconductor device on the circuit board, configured to receive the first voltage from the regulator through a power line in the circuit board, the semiconductor device comprising:
a substrate on the circuit board, stacked via conductive balls, and configured to receive the first voltage from the power line via the conductive balls;
a plurality of dies on the semiconductor device, stacked via bumps, each die of the plurality of dies comprising a first conductive via configured to receive the first voltage from the regulator via the bumps;
a plurality of pillars between adjacent dies of the plurality of dies and configured to couple the first conductive vias of the adjacent dies of the plurality of dies; and
a sense node switch circuit configured to selectively couple a first conductive via of a die among the plurality of dies to the regulator.

13. The apparatus of claim 12, wherein the sense node switch circuit comprises:
a sense line circuit configured to provide a second voltage to the regulator through a sense line in the circuit board; and
a plurality of switches corresponding to a plurality of dies, each switch of the plurality of switches being disposed on the corresponding die of the plurality of dies, between a corresponding first conductive via on the corresponding die and the sense line circuit,
wherein at least one switch of the plurality of switches is configured to selectively couple the first conductive via of the die among the plurality of dies to the regulator.

14. The apparatus of claim 13, wherein the sense line circuit comprises a plurality of second conductive vias in the corresponding plurality of dies and a plurality of second pillars coupling second conductive vias of adjacent dies of the plurality of dies.

15. The apparatus of claim 13, further comprising:
a controller on the circuit board, configured to provide a control signal to the sense node switch circuit signal through a control line in the circuit board, the control signal indicative of the one die among the plurality of dies,
wherein the sense node switch circuit is configured to selectively couple the first conductive via of the die among the plurality of dies to the regulator responsive to the control signal.

16. The apparatus of claim 15, wherein the sense node switch circuit comprises:

a control line circuit coupled to the plurality of switches and configured to provide the control signal from the controller to the plurality of switches, wherein the sense node switch circuit is configured to selectively activate a switch of the plurality of switches responsive to the control signal.

17. The apparatus of claim 12, wherein the plurality of dies are stacked to each other on the substrate.

18. The apparatus of claim 13, wherein the regulator is an operational amplifier, configured to regulate the first voltage responsive to the second voltage.

* * * * *